United States Patent [19]

Knowles et al.

[11] Patent Number: 4,604,523
[45] Date of Patent: Aug. 5, 1986

[54] SCANNABLE-BEAM MICROSCOPES AND IMAGE STORES THEREFOR

[75] Inventors: William R. Knowles, Newmarket; Ian A. Cruttwell, Great Chishall, Nr. Royston, both of England

[73] Assignee: Cambridge Instruments Limited, Cambridge, England

[21] Appl. No.: 570,083

[22] Filed: Jan. 12, 1984

[30] Foreign Application Priority Data

Jan. 15, 1983 [GB] United Kingdom ............... 8301096

[51] Int. Cl.$^4$ ........................................... G01N 23/00
[52] U.S. Cl. ................................. 250/310; 250/396 R
[58] Field of Search ............... 250/310, 311, 397, 399, 250/396, 306, 307

[56] References Cited

U.S. PATENT DOCUMENTS

| 3,628,012 | 12/1971 | Plows | 250/310 |
| 4,091,374 | 5/1978 | Müller et al. | 340/324 AD |
| 4,399,360 | 8/1983 | Fotino | 250/311 |

FOREIGN PATENT DOCUMENTS

| 0012262 | 6/1980 | European Pat. Off. | |
| 0087763 | 9/1983 | European Pat. Off. | 250/311 |
| 2553721 | 6/1977 | Fed. Rep. of Germany | 250/311 |
| 59118339 | 9/1981 | Japan | 250/311 |
| 1384493 | 2/1975 | United Kingdom. | |
| 1454097 | 10/1976 | United Kingdom. | |
| 1564628 | 4/1980 | United Kingdom. | |
| 2088671 | 6/1982 | United Kingdom. | |
| 2123249 | 1/1984 | United Kingdom | 250/311 |
| 2133150 | 7/1984 | United Kingdom. | |

OTHER PUBLICATIONS

Radio and Electronic Engineering, Oct. 1982, pp. 479-493.

Primary Examiner—Bruce C. Anderson
Assistant Examiner—Paul A. Guss
Attorney, Agent, or Firm—Leydig, Voit & Mayer, Ltd.

[57] ABSTRACT

A scanning electron microscope arrangement has an integral image store connected to receive signals from an electron collector which collects the secondary electrons emitted from the specimen surface in response to impingement by the electron beam. The latter is scanned over the specimen by scanning coils driven by a scan generator. A cathode ray tube is provided which has its separate scan generator and responds to the previously stored signals as they are read out from the store under control of a control unit. Because the arrangement has an integral store, the beam scanning rates of the electron beam and the CRT beam can be entirely independent. The scan generator for the electron beam may therefore have a relatively low rate and therefore a low power rating. The CRT can be a standard type and does not need to be high persistance. The signal to noise ratio of the signals in the store can be increased by repeating the scan of the specimen before reading out the signals.

10 Claims, 3 Drawing Figures

SCANNABLE-BEAM MICROSCOPES AND IMAGE STORES THEREFOR

BACKGROUND OF THE INVENTION

The invention relates to scannable-beam microscopes and image stores therefor and more specifically to scanning electron microscope arrangements and to image store arrangements therefor.

In known forms of scanning electron microscopes, an electron beam is directed at the surface of a specimen and causes secondary electrons to be produced from the specimen which are collected to produce an electrical signal which controls the brightness of a cathode ray tube. A scanning unit is provided which energises scanning coils with a suitable waveform so as to cause the electron beam to perform a scan, normally a frame scan, of the surface of the specimen, and this scanning unit is also arranged to control the time base of the CRT so that the CRT beam scans the CRT screen synchronously with the scanning of the specimen. In this way, an image of the specimen surface, in terms of the emitted secondary electrons, is produced.

A disadvantage of such an arrangement is that because the electron beam in the microscope column is scanned over the specimen surface synchronously with the beam in the CRT, both the column beam and the CRT beam must be capable of being scanned at the same rate. This means that the scanning coils and associated amplifying circuitry for scanning the column beam have to be capable of operating over a wide speed range, say from normal television rate at 50 or 60 Hz down to 100 seconds for a complete frame scan, this range of scanning speeds being necessary in order to produce signals of the required signal-to-noise ratio from a variety of different specimens. The wide range of required scanning speeds complicates the design of scanning coils and associated circuitry and imposes high power requirements on these components. In addition, such an arrangement complicates the CRT, which again has to be capable of handling a variety of scanning rates and will therefore need to have a high persistence screen.

It is also known to provide such arrangements with image stores for temporarily storing the signals produced by the emitted secondary electrons. However, the scanning coils and associated circuitry for scanning the column beam are still designed to cope with a wide range of scanning rates and therefore complex in design, and the CRT is also still arranged to handle a variety of scanning rates.

BRIEF SUMMARY OF THE INVENTION

According to the invention there is provided a microscope arrangement having a movable energy probe and a scannable display means for displaying electrical signals derived from the interaction between a specimen and the probe as it moves over the specimen, in which the scanning rate of the display means and the mode of movement of the probe over the specimen are fixed and independent of each other, and in which there is storage means for temporarily storing the signals derived from the specimen before they are displayed by the display means.

According to the invention, there is further provided a scanning electron microscope arrangement, comprising means for producing an inspecting electron beam, beam directing means for directing the inspecting beam to each of a plurality of positions on a specimen in turn whereby to cause emission of secondary electrons from that position on the specimen surface, storage means connected to receive and store in predetermined locations the electrical signals produced by the secondary electrons emitted from each such position, gating means operative to gate either the inspection beam or the said electrical signals on and off at a regular predetermined rate, a cathode ray tube having associated beam scanning means, first control means operative to read out the stored signals to control the brightness of the beam in the cathode ray tube, and second control means operative to control the beam directing means so that the said positions are arranged substantially randomly over the surface of the specimen.

According to the invention there is still further provided an image store arrangement for use with a scanning electron microscope, comprising an image store associated as a unit with (a) scan generating means for producing scanning signals for scanning an electron beam in a scanning electron microscope at a predetermined rate and (b) signal processing means for receiving electrical signals produced by secondary electron collecting means in a scanning electron microscope and storing the said electrical signals in the image store, and connecting means for connecting the said unit to a scanning electron microscope whereby the scan generating means scans the electron beam of the microscope at the predetermined rate and secondary electrons emitted from a specimen under impingement thereof by the electron beam produce electrical signals which are stored in the image store by the signal processing means.

DESCRIPTION OF THE DRAWINGS

Scanning electron microscopes and image store arrangements embodying the invention will now be described, by way of example only, with reference to the accompanying drawings in which.

DESCRIPTION OF PREFERRED EMBODIMENTS

Figure 1:
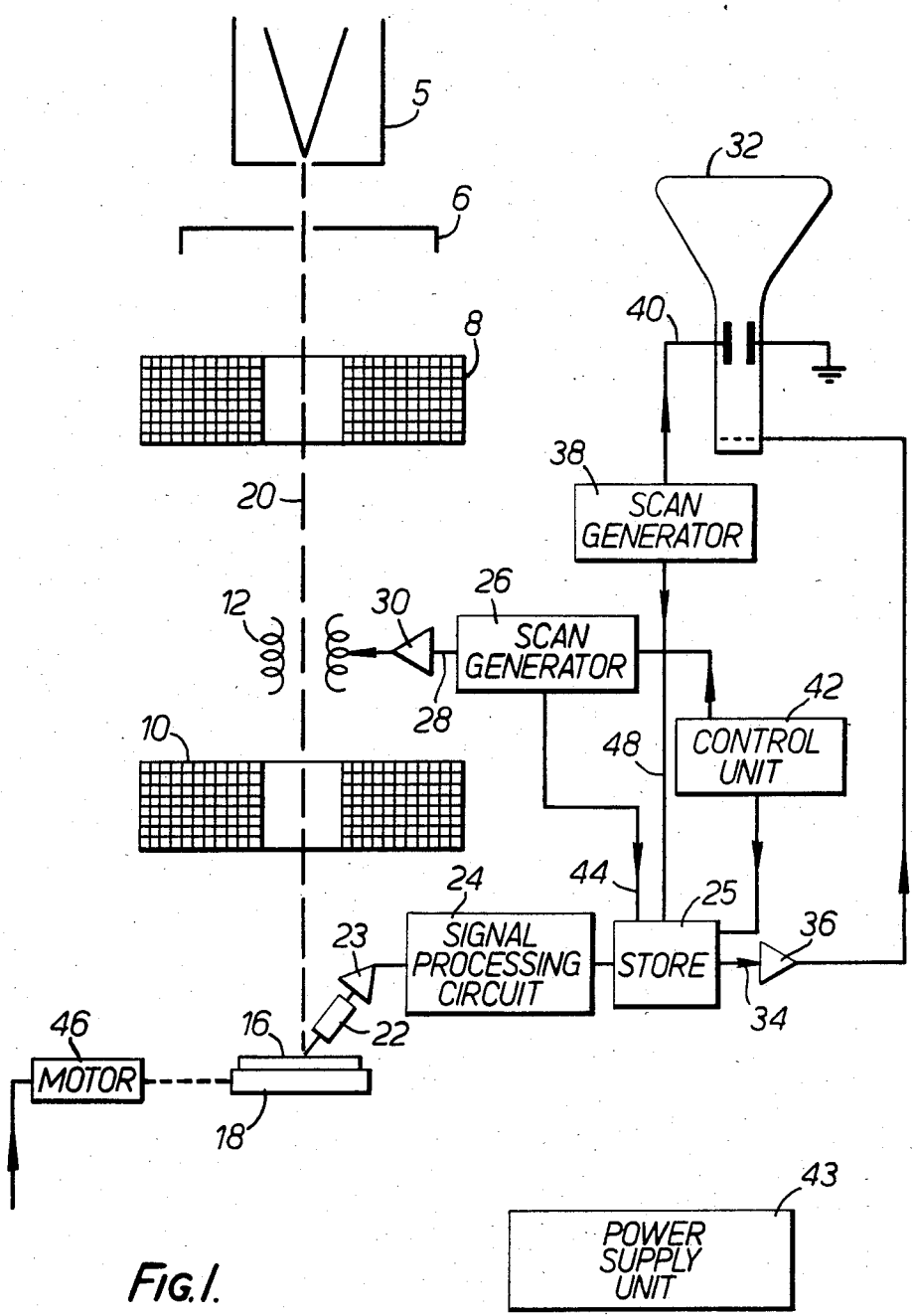
FIG. 1 shows one of the scanning electron microscopes schematically.

The scanning electron microscope shown in FIG. 1 has an electron gun 5, an accelerating anode 6, electron beam forming and final lenses 8 and 10, and scanning coils 12.

A specimen is positioned at 16 on a movable stage 18 so as to be impinged by an electron beam 20 produced by the gun 5. Secondary electrons produced from the specimen 16 as the result of its being struck by the electron beam 20 are picked up by a detector 22 which comprises any suitable form of electron collector, for example a scintillator connected to a photomultiplier. The resultant electrical signals corresponding in strength to the number of secondary electrons collected are amplified in a preamplifier 23 and passed via signal processing circuitry 24 to an image store 25.

A scan generator 26 is provided for generating a suitable waveform on a line 28 which is passed via an amplifier 30 to the scan coils 12, and energises the coils 12 so as to cause the beam 20 to scan a predetermined field of the surface of the specimen 16, such as a frame scan.

The arrangement also includes a cathode ray tube (CRT) 32 which may be of standard form. Its brightness is controlled by means of signals output from the store 25 on a line 34 and passed through an amplifier 36. It also has a scan generator 38 which controls its X and Y plates by means of line 40.

The operations of the image store 25, the scan generator 26 and the scan generator 38 are controlled by a control unit 42. A power supply unit 43 is provided for supplying power to the various electrical circuits via connections not shown.

In operation, the control unit 42 initiates the scan generator 26 to carry out a scan, such as a frame scan, of that part of the specimen 16 in the field of view of the electron beam 20, and the resultant secondary electrons produced from the surface of the specimen 16 are collected by the electron collector 22 and stored in the image store 25 in predetermined locations under the control of signals received from the scanning unit 26 on a line 44. The scan generator 26 has a fixed scanning rate, such as, for example, 100 seconds to perform a complete frame scan.

In order to increase the signal-to-noise ratio of the signals stored in the image store 25 in response to the secondary electrons collected by the collector 22, the control unit 42 may cause the scan generator 26 to repeat the scan (that is, to scan again the same, previously scanned, portion of the specimen (16). As the scan repeats, the electrical signal produced from the collector 22 for each scanned point of the raster is stored in the same storage location in the store 25 as was the electrical signal produced for that point during the previous scan. This process may be repeated several times.

The specimen 16 may then be re-positioned, by means of a motor 46 which re-positions the movable stage 18. One or more scans of the new part of the specimen surface within the field of view are then carried out and the resultant signals stored in another part of the image store 25.

The control unit 42 causes the signals stored in the store 25 is be displayed on the CRT 32 by energising the scan generator 38 which thereupon causes the CRT beam to perform a normal frame scan, at 50 or 60 Hz, and synchronously with this, the stored signals are read out of the store 25 by means of read signals produced on a line 48, and the read-out signals control the brightness of the CRT spot via line 34 and amplifier 36.

Because the arrangement has an integral image store 25, and because the scanning of the electron beam 20 across the specimen and the scanning of the electron beam in the CRT are independent, each scanning rate can be optimised. Thus, the scan generator 26 can be arranged to have a fixed scanning rate which is relatively slow and thus does not require high power. It is not necessary to provide variable scanning rates in order to enable the signal-to-noise ratio of the output signals to be increased, by reducing the scanning rate, in certain circumstances; instead, the signal-to-noise ratio can be increased merely by repeating the scan over the particular part of the specimen under investigation so as to produce the required strength of signal in the image store.

Furthermore, because the scanning of the CRT beam does not have to be synchronised with the scanning of the electron beam 20, the CRT can be of standard form. It does not have to have a high persistence screen in order to handle signals occurring at low scanning rates.

Figure 2:
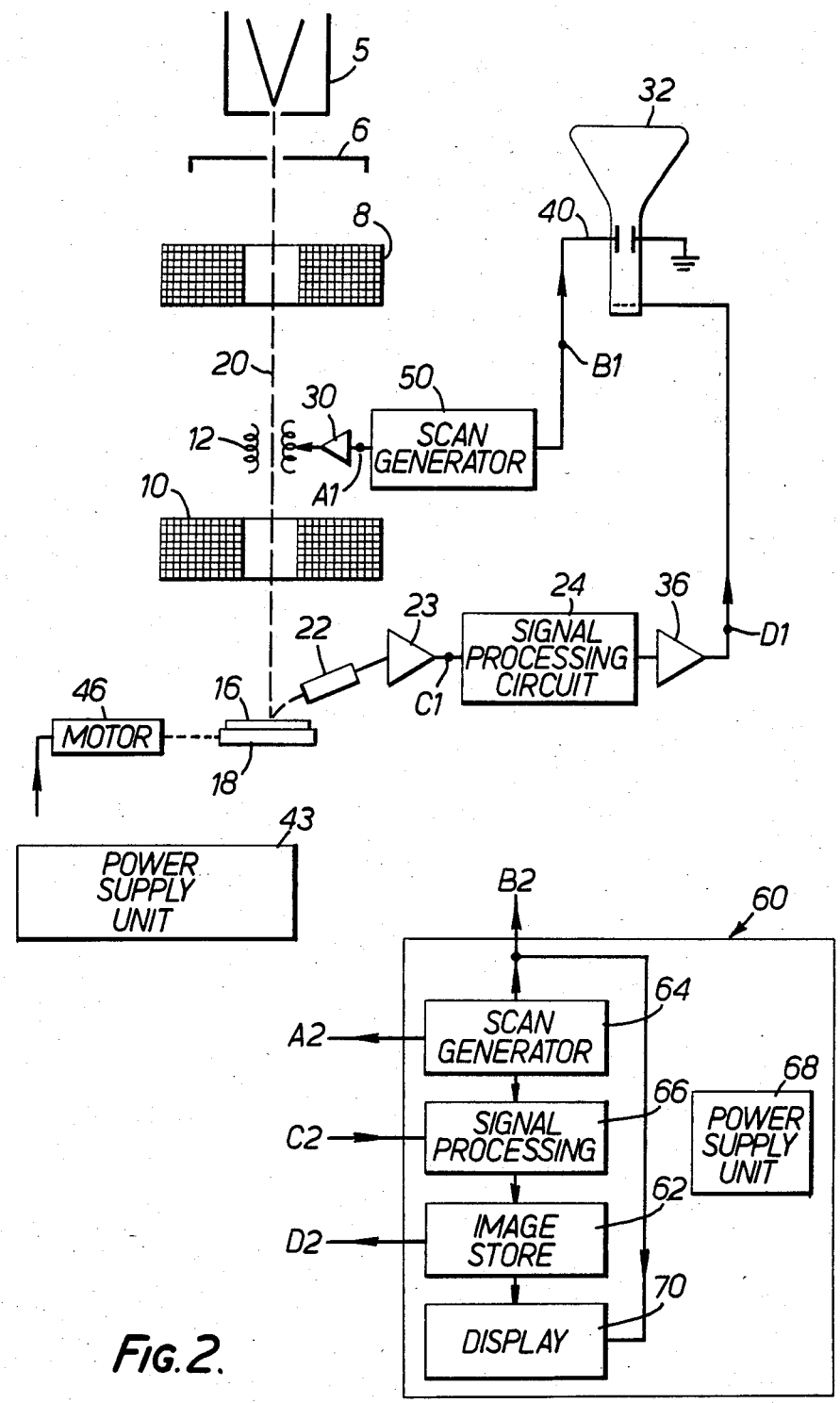
FIG. 2 shows a scanning electron microscope in schematic form and, separately, one of the image store arrangements.

FIG. 2 shows a scanning electron microscope without the integral image store 24 of FIG. 1. Items in FIG. 2 corresponding to items in FIG. 1 are correspondingly referenced. As shown in FIG. 2, the scanning electron microscope has the same general mechanical arrangement of the electron gun 5, anode 6, beam-forming and final lenses 8 and 10, scanning coils 12, and the movable stage 18 carrying the specimen 16. The electrical and electronic arrangements associated with the mechanical structure, that is, the electrical circuits for controlling and adjusting the lenses 8 and 10, the motor 46 for moving the stage 18 and the electron detector 22, are also the same as for the microscope shown in FIG. 1. However, instead of the separate scan generators 26 and 38 for the scanning coils 12 and the CRT 32 respectively, a single scan generator 50 is provided which feeds the scanning coils 12 of the microscope itself and also the scanning circuits of the CRT. The electrical signals from the electron detector 22 are passed via the pre-amplifier 23 and the signal processing circuitry 24 direct to the brightness control circuits of the CRT on the line 34. As so far described, therefore, the scanning electron microscope corresponds to the known form thereof described in the introduction to this specification; in particular the electron beam 20 will be scanned at the same rate as the scanning rate of the CRT.

However, also shown in FIG. 2 is an image store unit 60. This is a self-contained unit comprising an image store 62 of the same form as the image store 25 of FIG. 1, a scan generator 64, signal processing circuitry 66, a power supply unit 68 and (optionally) a display unit 70 in the form of a cathode ray tube. The connections within the unit 60 from the power supply unit 68 to the other components of the unit are omitted for clarity.

In use, the unit 60 may be connected to the scanning electron microscope shown in FIG. 2 so as to convert it into the form generally shown in FIG. 1. In order to carry out such connection and conversion, the circuitry of the scanning electron microscope in FIG. 2 is disconnected at the points A1, B1, C1 and D1, and the image store unit 60 is connected in position as will now be described, assuming initially that the optional CRT 70 is being used.

Thus, the output terminal A2 of the scan generator 64 is connected to terminal A1 so as to supply the scanning coils 12 via the amplifier 30, and the output from the pre-amplifier 23 at terminal C1 is connected to the input terminal C2 of the signal processing circuitry 66. The CRT 32 of the scanning electron microscope, as well as the scan generator 50 and the signal processing circuitry 24, are thus completely disconnected.

The arrangement now functions generally in a manner corresponding to that described above in relation to FIG. 1 with the display being provided by the display unit 70 of the image store unit 60. Thus, the scan generator 64 which, like the scan generator 26, has a fixed scanning rate (such as, for example, 100 seconds to perform a complete frame scan), controls the scan coils 12 so as to provide a fixed-rate scan of the electron beam 20. The electrical signals produced from the collector 22 are processed by the signal processing circuit 66 and stored in the image store 62 in the manner explained above in relation to FIG. 1. The output of the image store 62 feeds the CRT 70. The CRT 70 has its own built-in scan generator having a fixed scan rate.

Therefore, by providing an image store unit 60 of the form shown in FIG. 2, the scanning electron microscope shown in FIG. 2 can be easily converted into one having the same form and the same advantages as that described with reference to FIG. 1. Thus, the scan generator 64 does not have to be so flexible (that is, have to have a wide ranging number of different scanning speeds) as the scan generator 50. The scan generator 64 may, for example, merely have a single scan speed or perhaps two or three—whereas the scan generator 50 would need to have of the order of ten different scanning speeds. Furthermore, the CRT 70 can operate at an optimum scanning speed which will, in general, be different from the optimum scanning speed for the electron beam 20. The CRT 70 can thus scan at the normal television rate and can provide a flicker-free display—but there is no requirement on the electron beam 20 to scan at this high rate which imposes considerable loads on the scan generators 50 and the amplifier 30, as well as on the power supply unit 43.

The image store unit 60 need not incorporate its own CRT 70 or, if incorporated, it need not be used when the unit 60 is connected to the SEM. Instead, the output terminal B2 of the image store unit 60 may be connected to terminal B1 to feed a suitable time base to the CRT 32 which will thus be used as the display unit. This suitable time base would normally be at television rate and would be provided by the scan generator 64. This time base would be different from the time base provided by the scan generator 64 at its output terminal A2. In addition, the output of the image store 62 would be fed via its output terminal D2 to the terminal D1 of the electron microscope so as to control the brightness of the CRT 32.

Figure 3:
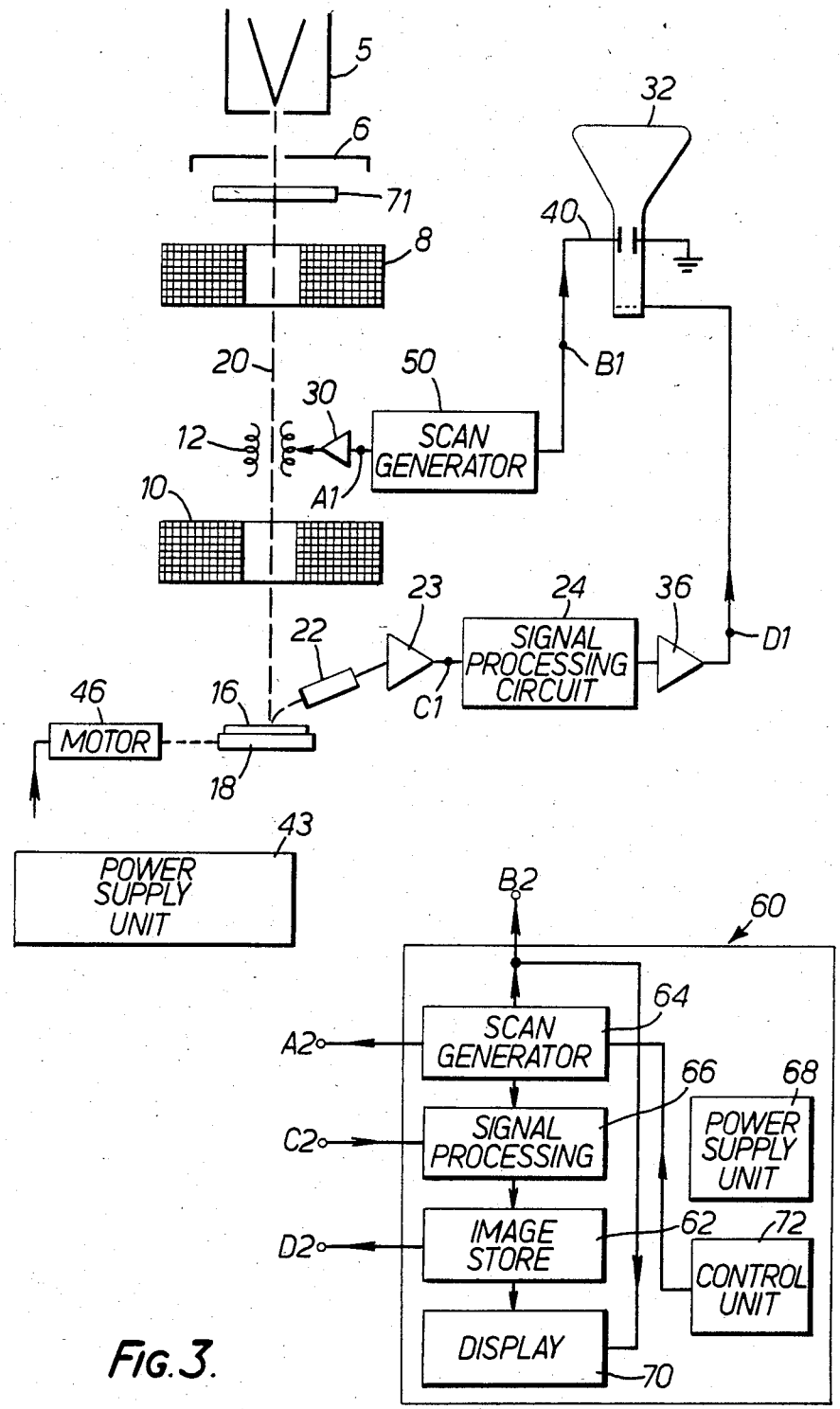
FIG. 3 corresponds to FIG. 3 but shows another of the image store arrangements.

In FIG. 3, items corresponding to those in FIG. 2 are correspondingly referenced.

In the arrangement of FIG. 3, the scanning electron microscope includes a beam blanking unit 71 which can be electronically controlled so as to pulse the electron beam 20 on and off (for a purpose to be described). For example, the beam blanking unit 71 may comprise a central slit or hole through which the electron beam 20 passes when aligned with the slit or hole, and deflecting means to which an electrical signal can be applied so as to cause the beam to be deflected so that, when it is deflected out of alignment with the slit or hole, it does not pass therethrough and is thus blocked from reaching the specimen 16.

A scanning electron microscope of the form shown in FIG. 3 is advantageous for investigating cyclically varying phenomena in the specimen 16. Such cyclically varying phenomena include varying electrical potentials in the specimen 16 when it is, for example, in the form of an integrated circuit whose behaviour under operating conditions is being investigated. In order to carry out such an investigation, the beam 20 may be scanned across the specimen at a rate determined by the scan generator 50 and the resultant electrical signals produced by the detector 22 are used to control the brightness of the CRT 32 in the manner explained with reference to FIG. 2. The secondary electrons which are emitted by the specimen 16 and detected by the detector 22 so as to produce the output electrical signals will depend on the electrical potentials in the specimen, and the image produced on the CRT 32 will thus be in terms of the potentials across the surface of the specimen, that is, in terms of "voltage contrast". However, it is often necessary, in order to increase the sensitivity of the system, to build up a complete image on the CRT 32 by carrying out several scans of the specimen, thus using a CRT screen with a long persistence. Such an arrangement is clearly unsatisfactory, though, where the cyclically varying phenomenon being investigated is varying at a rate which is of the same order (or higher) than the repitition rate at which the surface of the specimen is scanned; in such a case, the resultant image produced by the CRT 32 will be confused because it will be built up from signals produced at different phase positions in the cycle of the varying phenomenon. If, therefore, the varying phenomenon is a cyclically varying potential in the specimen, the arrangement will not produce a proper "voltage contrast" image.

This disadvantage may be overcome by bringing into use the beam blanking unit 70 and driving it in synchronism with (that is, at the same frequency as, or at a submultiple of the frequency of) the frequency of the cyclically varying phenomenon. Therefore, the electron beam 20 can now be scanned several times over the specimen 16 (in order to build up a stronger image on the CRT 32) but the gating of the beam in synchronism with the cyclically varying phenomenon ensures that each point on the CRT screen will represent the image of the corresponding point on the specimen surface under constant conditions. If the cyclically varying phenomenon is the electrical potential in the specimen 16, each image point on the CRT screen will represent the image of the corresponding point on the specimen surface under constant electrical potential (that is, at corresponding points in successive cycles of the varying potential).

As shown in FIG. 3, an image store unit 60 is provided, corresponding generally to the image store unit 60 of FIG. 2. In use, the image store unit 60 of FIG. 3 is connected into the scanning electron microscope shown in that Figure in similar fashion to that explained in conjunction with FIG. 2 (either making use of the CRT 32 or its own integral CRT 70).

Therefore, the electron beam is scanned over the specimen surface and the beam is pulsed on and off by the beam gating unit 70 in synchronism with the varying phenomenon in the specimen. The resultant electrical signals from the detector 22 are processed by the signal processing unit 66 and stored in the image store 62. The read-out signals from the image store 62 are used to control the brightness of the CRT 32 or the brightness of the CRT 70 in the manner already explained in conjunction with FIGS. 1 and 2. Such an arrangement has all the advantages already described of using an image store 62 with optimum, different, scanning speeds for the electron beam 20 on the one hand and the CRT on the other.

In addition, however, the image store unit 60 in FIG. 3 has a control unit 72 for controlling the scan generator 64 and the image store 62 to enable other modes to be used.

In one such mode, the beam 20 is not scanned continuously across the specimen surface (and regularly gated off as explained) but is instead "parked" at each of a plurality of regularly arranged points on the surface of the specimen. While parked at each such point, the beam is cyclically gated on and off by the beam blanking unit 70 in the manner explained and the resultant electrical signals produced by the detector 22 are stored in a corresponding storage location in the image store 62. The beam is then moved on and parked in the next position, where this process is repeated. In this way, the effect of multiple inspection of the specimen surface is produced, so as to increase sensitivity; and the resultant stored image in the image store 62 can be read out and displayed on the CRT at the optimum scanning speed for the CRT.

However, the method just described, as well as the method in which the electron beam 20 is continuously scanned across the specimen surface, while being gated on and off by the beam blanking unit 70 to build up a stored image in the image store 62, suffers from the disadvantage that interrelationship between the gating frequency and the scanning rate can cause "fringes" or regular patterns to occur in the image produced on the CRT screen. Such fringes or regular patterns tend to be recognised by the observer's eye and to be distracting.

It has been discovered that such fringes or patterns can be avoided by operating the image store in a second mode under control of the control unit 72. In this second mode, the scan generator 64 no longer in fact causes a scan of the specimen surface. Instead, the electron beam 20 is moved in turn to a plurality of different positions on the specimen surface, such positions being arranged randomly or pseudo- or nearly-randomly on the specimen surface. As before, the electron beam is switched on and off by the beam blanking unit 70 in synchronism with the cyclically varying phenomenon under investigation in the specimen while the beam is at each such position. The resultant electrical signals produced by the detector 22 are stored in corresponding storage locations in the image store 62 and may be read out at the fixed, optimum, scanning speed for the CRT to produce the required display. It is found that the random or nearly random arrangement of the positions on the specimen surface which are inspected in turn by the electron beam 20 avoids the production of the "fringes" on the screen.

If desired, the electron beam 20 may be "parked" at each random or nearly random position on the specimen surface 16 while the beam is switched on and off several times.

Instead of the beam blanking unit 70, a gating arrangement may be used which carries out gating (in synchronism with the varying phenomenon in the specimen) at some point in the signal path between the specimen and the CRT screen.

The invention is not restricted to use with a scanning electron microscope but may be used with other microscope arrangements having a movable energy probe, for example, ion microscopes, optical microscopes and acoustic microscopes.

What is claimed is:

1. A microscope arrangement having a movable energy probe and a scannable display means for displaying electrical signals derived from the interaction between a specimen and the probe as it moves over the specimen, in which
    the scanning rate of the display means and the mode of movement of the probe over the specimen are fixed and asynchronous with, different from and independent of each other,
    the mode of movement of the energy probe is a mode in which the probe is directed to each of a plurality of substantially randomly arranged positions on the specimen, and
    including storage means which forms an integral part of the microscope arrangement and is for temporarily storing the signals derived from the specimen before they are displayed by the display means.

2. An arrangement according to claim 1, including gating means for gating the energy probe on and off at a regular predetermined rate.

3. An arrangement according to claim 1, including gating means for gating the electrical signals on and off at a regular predetermined rate.

4. An arrangement according to claim 1, including control means operative to cause the gating means to carry out a plurality of gatings while the probe is held at each said position.

5. An arrangement according to claim 3, including control means operative to cause the gating means to carry out a plurality of gatings while the probe is held at each said position.

6. An arrangement according to claim 1, in which the energy probe is an electron beam.

7. An arrangement according to claim 1, in which the scannable display means is a cathode ray tube and including means operative to control the brightness of the display on the screen of the cathode ray tube in dependence on the signals stored in the storage means.

8. A scanning electron microscope arrangement, comprising
    means for producing an inspecting electron beam,
    beam directing means for directing the inspecting beam to each of a plurality of positions on a specimen in turn whereby to cause emission of secondary electrons from that position on the specimen surface, storage means connected to receive and store in predetermined locations the electrical signals produced by the secondary electrons emitted from each such position, gating means operative to gate either the inspection beam or the said electrical signals on and off at a regular predetermined rate,
    a cathode ray tube having associated beam scanning means,
    first control means operative to read out the stored signals to control the brightness of the beam in the cathode ray tube, and
    second control means operative to control the beam directing means so that the said positions are arranged substantially randomly over the surface of the specimen.

9. A image store arrangement for use with a scanning electron microscope, comprising
    an image store associated as a unit with (a) scan generating means for producing scanning signals for scanning an electron beam in a scanning electron microscope at a predetermined rate, (b) signal processing means for receiving electrical signals produced by secondary electron collecting means in a scanning electron microscope and storing the said electrical signals in the image store, and (c) a cathode ray tube, means for reading out the stored signals from the image store for producing a display on the cathode ray tube, and means for causing the cathode ray tube to scan at a predetermined rate which is different from, asynchronous with and independent of the said predetermined rate of the scan generating means,
    connecting means for connecting the said unit to a scanning electron microscope whereby the scan generating means scans the electron beam of the microscope at the predetermined rate and secondary electrons emitted from a specimen under impingement thereof by the electron beam produce electrical signals which are stored in the image store by the signal processing means, the said unit including control means operative to direct the electron beam in the scanning electron microscope to each of a predetermined plurality of substantially random positions in turn and a means for selectively rendering the control means operative instead of the scan generating means.

10. An image store arrangement for use with a scanning electron microscope, comprising an image store associated as a unit with (a) beam directing means for producing control signals for directing an electron beam in a scanning electron microscope to each of a plurality of substantially randomly positioned points on a specimen surface in turn and (b) signal processing means for receiving electrical signals produced by secondary electron collecting means in the scanning electron microscope and storing the said electrical signals in the image store, and connecting means for connecting the said unit to a scanning electron microscope whereby the beam directing means directs the electron beam of the microscope to the said points in turn and secondary electrons emitted from a specimen under impingement thereof by the electron beam produce electrical signals which are stored in the image store by the signal processing means.

* * * * *